United States Patent
Gao

(10) Patent No.: US 12,247,794 B2
(45) Date of Patent: Mar. 11, 2025

(54) RACK COOLING DISTRIBUTION SYSTEM WITH LEAK DETECTION

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 901 days.

(21) Appl. No.: 17/349,424

(22) Filed: Jun. 16, 2021

(65) Prior Publication Data

US 2022/0404109 A1 Dec. 22, 2022

(51) Int. Cl.
- F28F 27/00 (2006.01)
- G01M 3/28 (2006.01)
- H05K 7/20 (2006.01)

(52) U.S. Cl.
CPC .......... *F28F 27/00* (2013.01); *G01M 3/2807* (2013.01); *H05K 7/20272* (2013.01); *H05K 7/20781* (2013.01); *F28F 2265/16* (2013.01)

(58) Field of Classification Search
CPC ........ F28F 27/00; F28F 2265/16; G01M 3/28; G01M 3/26; G01M 3/188; G01M 3/2087; G01M 3/04; G01M 3/186; H05K 7/20; H05K 7/20781; H05K 7/20272
See application file for complete search history.

(56) References Cited

FOREIGN PATENT DOCUMENTS

| CN | 112911905 A | * | 6/2021 | ......... H05K 7/20709 |
| JP | 2012102667 A | * | 5/2012 | |
| KR | 20150015805 A | * | 2/2015 | |

* cited by examiner

*Primary Examiner* — Harry E Arant
(74) *Attorney, Agent, or Firm* — WOMBLE BOND DICKINSON (US) LLP

(57) ABSTRACT

A liquid cooling distribution system can be installed to an information technology (IT) rack to deliver and distribute fluid to IT equipment. The liquid cooling system can include a fluid manifold and a container that is arranged to capture a fluid that leaks from the fluid manifold. A first fluid sensor can be arranged to detect the fluid at a first position in the container. A controller can be configured to reduce a flow of the fluid into the fluid manifold and pump out fluid from the fluid manifold, in response to the fluid in the container being detected at the first position. Further remedial measure can be taken based on various detected leak scenarios.

18 Claims, 6 Drawing Sheets

RACK COOLING DISTRIBUTION SYSTEM WITH LEAK DETECTION

FIELD

Embodiments of the present disclosure relate generally to a cooling system for an information technology (IT) rack. In particular, the cooling system can respond to detected leaks.

BACKGROUND

Information Technology (IT) includes technology such as computers that are accessible through the internet or a local network, which provide storage of, or access to, data, websites, computer programs, algorithms, services, and more. IT equipment such as servers and other electronic devices (e.g., peripheral devices) can be installed in a chassis. These chassis can then be installed in an IT rack. An IT rack can be populated with a plurality of chassis, each housing IT equipment, as a manner of managing power and thermal requirements of the IT equipment.

A liquid cooling system transfers and delivers liquid between an IT rack and the chassis, and between the chassis and the IT equipment that is mounted on the chassis. Such a system can provide high operational and cooling efficiency of the IT equipment. Liquid cooling for high power density electronics has increased in popularity because air cooling can be thermally insufficient in some circumstances. Liquid cooling allows for higher packaging density and increased computing load of electronics, by transferring greater thermal energy from the electronic equipment.

Liquid cooling systems can be susceptible to fluid leaks, which can damage IT equipment. When a leak is detected in an IT rack, some or all the equipment in the IT rack may need to be shutdown to prevent damage to electronics in a timely manner. The IT equipment may need time, however, to smoothly exit operations, preserve data or application states, notify parties, or perform other tasks related to a graceful shutdown. Some solutions may shut down the system as soon as any leak is detected, however, such solutions may require introducing individual fluid components to achieve a server level control. Some solutions, even after a leak is detected, may not be equipped to reduce the leaking of the fluid or exposure of the electronics to the fluid. Further, existing cooling solutions may be able to detect a leak in electronics, but not a leak from the manifold of an IT rack, or a leak between the chassis and the manifold. Thus, there is a need for a cooling solution that addresses issues described.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
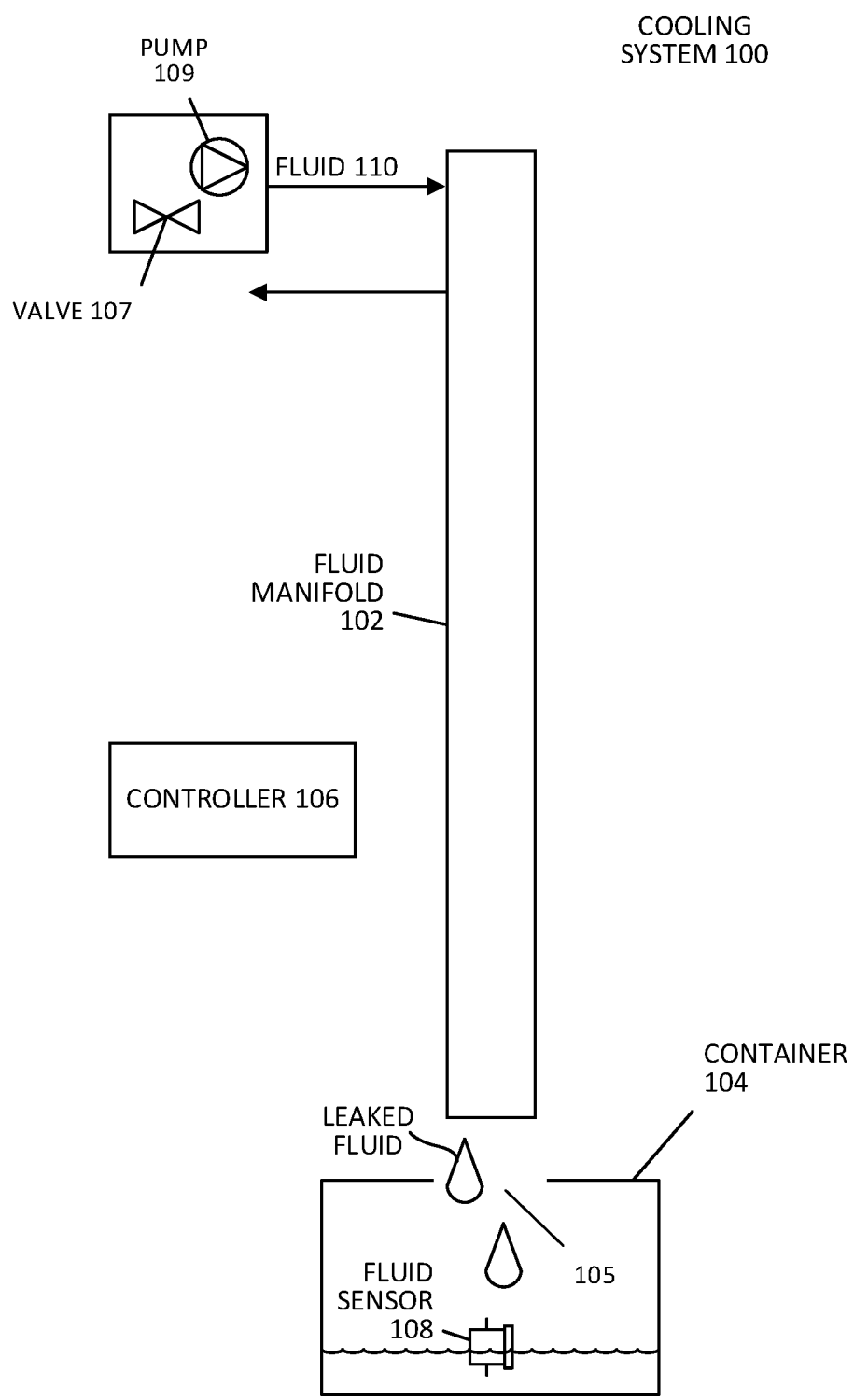
FIG. 1 shows a cooling system with a leak sensing container, according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Liquid cooling systems can circulate fluid to and from IT electronics within an IT rack. Within an IT rack, leaks within the liquid cooling system can be common, due to the various conduits, connectors, fittings, adapters, and other parts that the fluid travels through or interfaces with. Fluid can leak at different rates, depending on the severity of the leak. In order to facilitate graceful shutdown, protect IT equipment, and maintain operability of IT equipment as long as possible, a cooling system can have an architecture and an operation strategy as described in the present disclosure to address various scenarios of fluid leakage.

Aspects of the cooling system of the present disclosure can detect different levels and severities of a leak that originate from a fluid distribution manifold of an IT rack or between a chassis holding the IT equipment and the manifold. The cooling system can respond to such a leak, and/or adjust the response based on the severity or level of the leak. For example, the system can decrease the amount of the fluid flowing into the cooling system, which can reduce potential harm to the electronic equipment. Overall system reliability can be improved by not implementing a one-size-fits-all response for each detected leak. Aspects of the cooling system can be flexible and deployable in different system architectures; for example, the system can be deployed with a localized pumping system (e.g., a closed system architecture) or central pumping system (e.g., an open system architecture).

In some aspects of the present disclosure, a liquid cooling system for an IT rack is described. The cooling system can include a fluid manifold; a container, arranged to capture a fluid that leaks from the fluid manifold; a first fluid sensor, arranged to detect the fluid at a first position in the container; and a controller, that is configured to reduce a flow of the fluid into the fluid manifold, in response to the fluid in the container being detected at the first position. In such a manner, the cooling system can sense a leak and reduce the potential damage to IT equipment, while buying additional time for the IT equipment to shut down. Additionally, as described in other sections, the cooling system can include features that detect and respond to other leak scenarios that can vary in severity.

FIG. 1 shows a cooling system 100 with a leak sensing container, according to some embodiments. The cooling system can be integrated with an IT rack to distribute fluid to and from IT equipment.

The cooling system can include a fluid manifold 102. The fluid manifold can include one or more conduits that supply fluid (e.g., a liquid coolant such as water, propylene glycol, etc.) to IT equipment in an IT rack, which can be referred to as a manifold supply line. The fluid manifold can include one or more conduits that receive the fluid from the IT equipment, which can be referred to as a manifold return line. The manifold return line receives the fluid from the IT equipment and returns that fluid to an external liquid source. As such, the manifold can circulate fluid to and from the IT equipment in the IT rack. This fluid can be referred to as IT rack level fluid. In some embodiments, the IT rack level fluid can be fluidly isolated from an external fluid, but thermally connected to it (e.g., via a heat exchanger).

Thermal energy can be transferred away from IT equipment as the fluid circulates through thermally conductive parts such as cold plates that are also thermally connected to the IT equipment. As mentioned, however, leaks can spring along the path of the fluid. The manifold, in particular, can have many points of fluid connection to and from the IT equipment. Failure of parts, failure to properly mate connectors, wear and tear, and/or improper installation can lead to a leak on or near the manifold. It is appreciated that failures typically do not result in the escaped fluid projecting outward from openings in an explosive manner. Rather, failures tend to manifest with fluid leaking, dripping, and/or traveling on a structure from which the fluid leaks, such as for example, the manifold.

Figure 3:
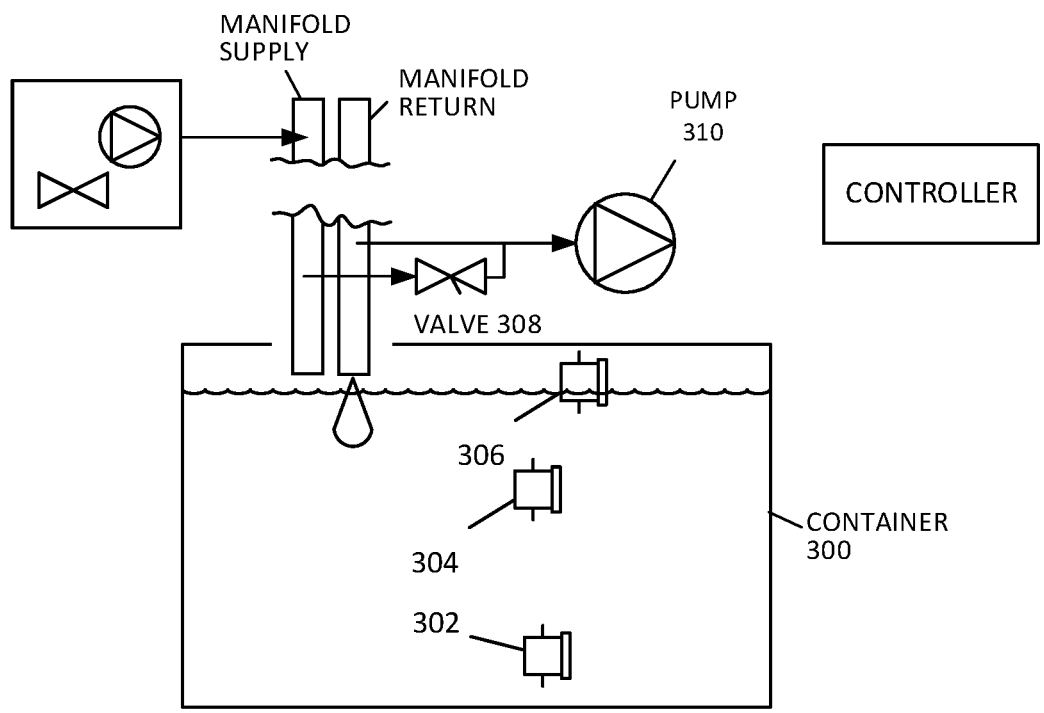

A container 104 can be arranged to capture the fluid that leaks from the fluid manifold and/or from between the manifold and the chassis. For example, the container can be positioned at the bottom of the manifold, below the manifold, or directly underneath the manifold. In other examples, one or more ducts or channels can be placed in positions at, below, or directly underneath the manifold, to capture the leaked fluid and direct it to container. The container can be arranged below a supply line and/or a return line of the fluid manifold, having one or more openings 105 into which the fluid flows when the fluid leaks from the fluid manifold. In some embodiments, the fluid manifold is at least partially entering the container through one or more openings at a top region of the container, for example, as shown in FIG. 3. In some embodiments, the manifold may be substantially or completely contained by the container, as shown, for example, in FIG. 4. Regardless of whether the container directly or indirectly receives the leaked fluid, the container can be arranged to capture the leaked fluid from the fluid manifold.

In FIG. 1, one or more fluid sensors, such as a first fluid sensor 108 can be arranged to detect the fluid at a first position in the container. The position of each sensor can correspond to a level in the container. Thus, sensor 108 indicates whether or not fluid is at a particular level in the container where the sensor is positioned. The fluid sensor can change when the fluid reaches the position of the sensor in the container. The one or more fluid sensors can include optical sensors, capacitive sensors, conductive sensors, a diaphragm, a float device, or other fluid sensing technology.

A controller 106 can be configured to reduce a flow of the fluid into the fluid manifold, in response to the fluid in the container being detected. For example, the controller can reduce an effort of a pump 109 that pumps fluid into the manifold, and/or reduce an opening of a valve 107 at the input of the manifold. In some embodiments, in addition to reducing the flow, the controller can activate one or more pumps that can be fluidly connected to a return line of the manifold, to pump out the fluid from a return line of the fluid manifold, in response to the fluid in the container being detected at the first position, as described in other sections. Thus, the fluid within the cooling system can be slowly emptied, to allow the IT equipment to shutdown gracefully. The controller can initiate shutdown of the any of the IT electronics through one or more commands and/or by cutting power to them.

The one or more sensors, pumps, or valves can be hardwired to the controller (e.g., through digital or analog I/O), and/or communicate with the controller through wireless communications. Operations, methods, and processes performed by processing logic of the controller, which can comprise hardware (e.g. circuitry, dedicated logic, etc.), software (e.g., embodied on a non-transitory computer readable medium), or a combination of both. The controller can include a single computing device, or an aggregate of multiple devices that perform operations distributed between the multiple devices.

Figure 2:
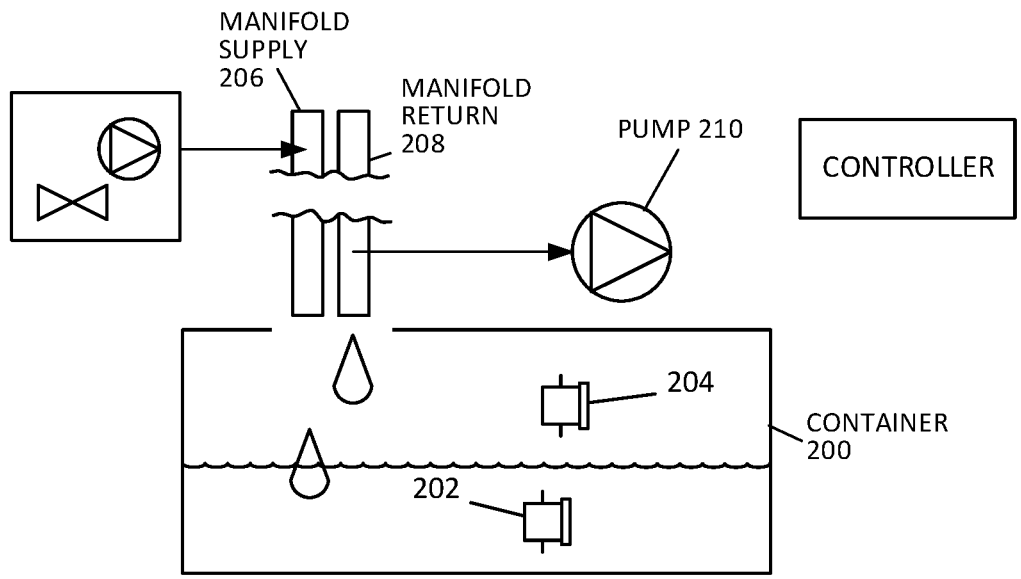
FIGS. 2-4 show examples of leak sensing containers, according to some embodiments.
Figure 4:
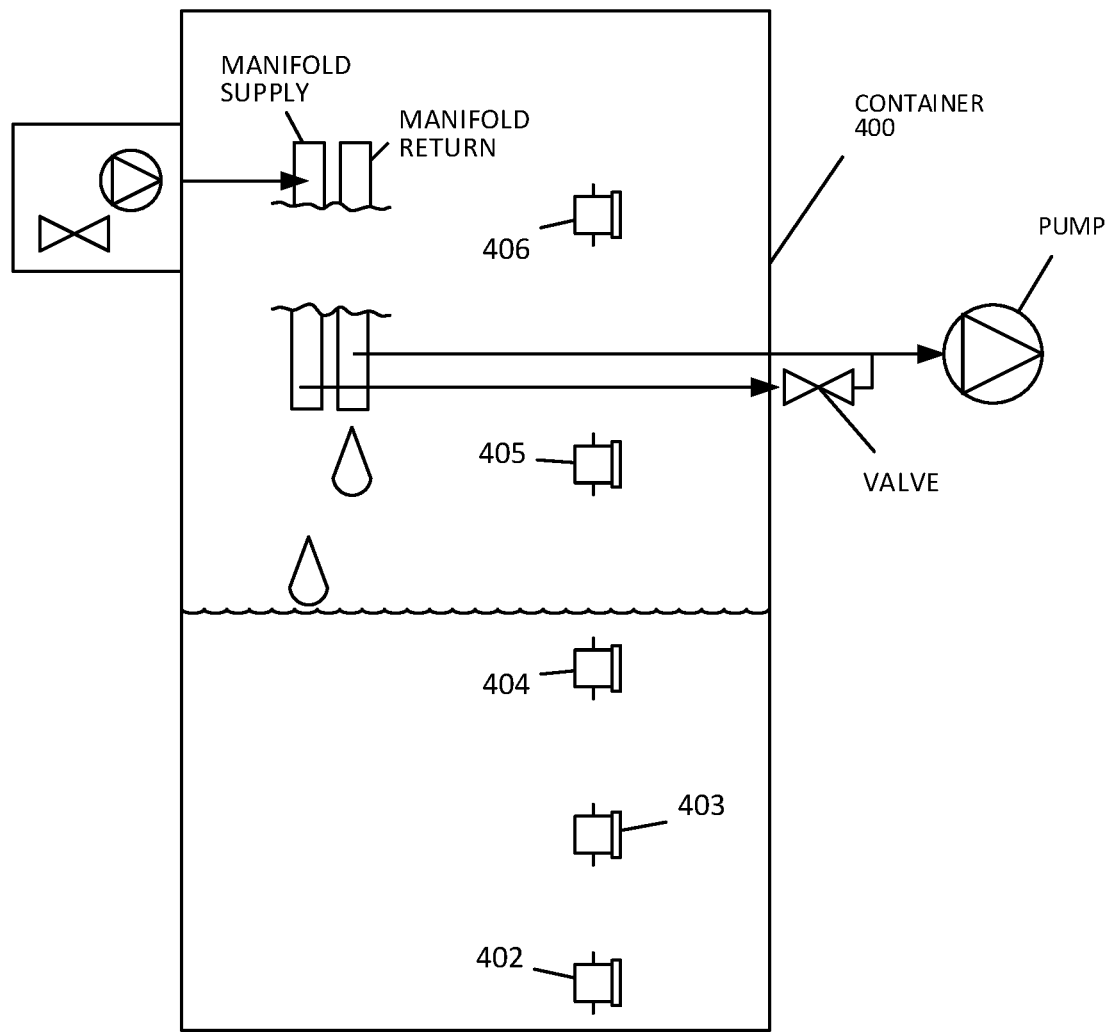

FIG. 2, FIG. 3, and FIG. 4 show examples of leak sensing containers, according to some embodiments. The leak sensing container can be fixed to or integrated as a component of the manifold. In FIG. 2, a fluid container 200 can be arranged to capture leaked fluid from an IT rack manifold. The manifold can include a manifold supply line 206 that delivers fluid to IT equipment, and a manifold return 208 that receives fluid from the IT equipment. The container 200 can include one or more sensors such as a first fluid sensor 202 at a first position in the container, and a second fluid sensor 204 arranged at a second position in the container that is higher than the first position. If the fluid is detected at the first sensor, the controller can respond by reducing the flow of fluid into the manifold supply line 206. Additionally, one or more pumps 210 can be arranged on the manifold return line (e.g., at a bottom region of the manifold return line). In response to the fluid being detected by the first sensor, the controller can activate the one or more pumps 210 that pumps fluid out of the return manifold. It should be understood that the figures show schematic representations of the various embodiments but is not meant to accurately represent detailed geometry, form factors, locations, proportions, shape, or size of the systems that are represented.

In response to the fluid being detected by the second fluid sensor 204 at the second position, a controller can be configured to determine a difference in time between when the fluid is detected at the first position, and when the fluid is detected at the second position in the container. The controller can further reduce the flow of the fluid into the fluid manifold based on the difference in time.

If the difference in time is less than a predefined threshold, then the controller can further reduce the flow of the fluid into the fluid manifold and continue to pump out the fluid from the return line 208 of the fluid manifold (e.g., by controlling pump 210). For example, the controller can adjust a position of an input valve or a pump to further reduce the fluid entering the manifold supply 206. In some embodiments, the controller can completely stop the flow of fluid into the manifold supply. If the difference in time is not less than the threshold, then the controller can maintain the reduced flow of the fluid into the fluid manifold and still continue to pump out the fluid from the return line of the fluid manifold.

For example, if sensor 202 first senses the fluid at t1, the controller may initially reduce the flow of fluid into the tank, by reducing a pump effort that pumps fluid into the manifold, or by adjusting a position of a valve at the input of the manifold to make the valve opening smaller. In addition, the controller can activate a pump to pump out fluid from the return line of the manifold. Thus, the controller can slowly reduce the amount of fluid that is in the cooling system, which can allow the equipment to operate longer and buys time to gracefully shut down the equipment.

If, the leaked fluid is detected by the second sensor t1+delta_t seconds later (e.g., at delta_t=t2 seconds), if t2 is greater than the predefined threshold, then the controller may not further reduce the flow of fluid into the manifold, because this can be deemed as a slow leak. However, a warning can be set and a service check can be scheduled. The controller may maintain the remedial measure previously taken when the first fluid sensor detected the leak, such as maintain the reduced fluid flow into the manifold and continue pumping the fluid out of the return line of the manifold.

If, however, the leaked fluid is detected by the second sensor at the second position of the container only t3 seconds after the fluid was detected by the first sensor (e.g., where t3 is less than the predefined threshold), then the controller can further reduce the flow of the fluid into the manifold. For example, the controller can completely stop the flow of the fluid into the fluid manifold by shutting off a pump and/or closing a valve arranged at the input of the fluid manifold. The controller can maintain pumping out the fluid from the return line of the fluid manifold, for example, with pump 210.

In such a manner, the controller can adjust the response to the leak based on the severity of the leak. The faster that the container is filling up (which is indicated with a small time difference between when the first sensor detected the leak and the second detector detected the leak), the more severe the leak. In response to a fast leak, the controller can further reduce or completely shut off the input fluid to the manifold. The controller can store a time stamp when each fluid sensor detects fluid, and take a difference between the time stamps to determine the time difference. A threshold time difference t* can vary depending on placement of the sensors (e.g., the heights of each position on the container) and the volume of the container, and can be determined based on testing, simulation, and/or calculations.

In FIG. 3, a cooling system can include a container 300 with one or more leak sensors such as a first fluid sensor 302, a second fluid sensor 304, and a third fluid sensor 306. The first fluid sensor can be arranged to detect the leaked fluid at a first position in the container. The second sensor can be arranged to detect the leaked fluid at a second position in the container, at a level higher than the first position. Similarly, the third sensor can be arranged to detect the fluid at a third position in the container that is higher than the second position.

Similar to as mentioned in other sections, in response to a leak being detected by the first sensor 302, a controller can reduce the flow of fluid into the manifold and pump fluid out of the manifold return line. In response to fluid being detected by the second sensor 304 at the second position, the controller can determine how fast the leak is based on the time elapsed from when the first sensor detected the fluid and when the second sensor detected the fluid. If this time difference is below a threshold then the leak is deemed by the controller to be fast, and the fluid flow into the manifold can be further restricted (e.g., completely stopped). Otherwise, the controller can maintain the remedial action taken in response to the detection of fluid at the first position.

In response to the fluid being detected by the third sensor 306 at the third position, the controller can completely stop the flow of the fluid into the fluid manifold (if it has not already been stopped), continue to pump out the fluid from the return line of the fluid manifold, and further pump out the fluid from a supply line of the fluid manifold.

For example, a pump 310 can be fluidly connected to the manifold return line to extract the fluid from the return line. A valve 308 can be in a normally closed position, but controlled to open when the fluid is detected at the third position. As a result, the controller pumps out fluid from the manifold supply line, using the same pump 310.

In such a manner, when the third fluid sensor detects the leaked fluid at the third position, the controller treats this as an indication to take a drastic response—pump out fluid from the manifold supply and return line, while completely stopping flow of fluid into the manifold. The fluid in the cooling system is quickly extracted, prioritizing the risk of damage to the IT equipment over providing time to the IT equipment to shutdown gracefully. It should be understood that the cooling system can include other arrangements of components to achieve the same purpose of pumping fluid from the manifold, for example, the manifold supply and manifold return can have separate pumps that are each controllable by the controller, as shown in other embodiments.

In FIG. 4, a cooling system can include a container 400 with one or more leak sensors such as a first fluid sensor 402, a second fluid sensor 403, a third fluid sensor 404, a fourth fluid sensor 405, and a fifth fluid sensor 406. In some aspects, the container can include additional fluid sensors. Each fluid sensor can sense leaked fluid at a respective position that indicates a level of leaked fluid collected in the container 400. The lowest position (e.g., the first fluid sensor) can indicate whether or not a leak is present. If so, the controller can reduce flow of fluid into the manifold supply line. If not, the controller can allow the fluid to flow into the manifold at a typical rate, e.g., at a default pump effort.

Further, any detection of the leaked fluid any of the other sensors 403-406 can be used as a basis by the controller to determine the rate of the leak. For example, as described in other sections, if sensor 405 detects fluid at its respective position, then the controller can determine a difference in time (e.g., a lapsed time) between when sensor 404 detected the fluid and when sensor 405 detected the fluid. If this time is below a threshold t*, then the controller can further reduce the flow of the fluid into the manifold, and maintain pumping of the fluid from the return line of the manifold. Otherwise, the previous remedial action can be maintained.

In some embodiments, if the fluid is sensed at the top most fluid sensor (e.g., sensor 406), then the controller can completely stop the fluid flow into the manifold supply, and pump out fluid from both the manifold supply and return.

In such a manner, the cooling system can operate with a plurality of sensors (e.g., three or more). The sensor that detects the lowest position can be used to detect that there is a leak, and take some remedial measure (e.g., reduce flow and pump out fluid from the return line of the manifold. The remaining sensors can be used by the controller to determine the rate of the leak. If the rate is high then (e.g., *t is below a threshold), then additional measures can be taken, such as further reducing the flow of fluid into the manifold or stopping the flow completely. The sensor that detects the highest position can be used by the controller to take the most drastic measure, such as stopping the flow of fluid into the manifold completely, and pumping the fluid out of the manifold supply and return lines.

Figure 5:
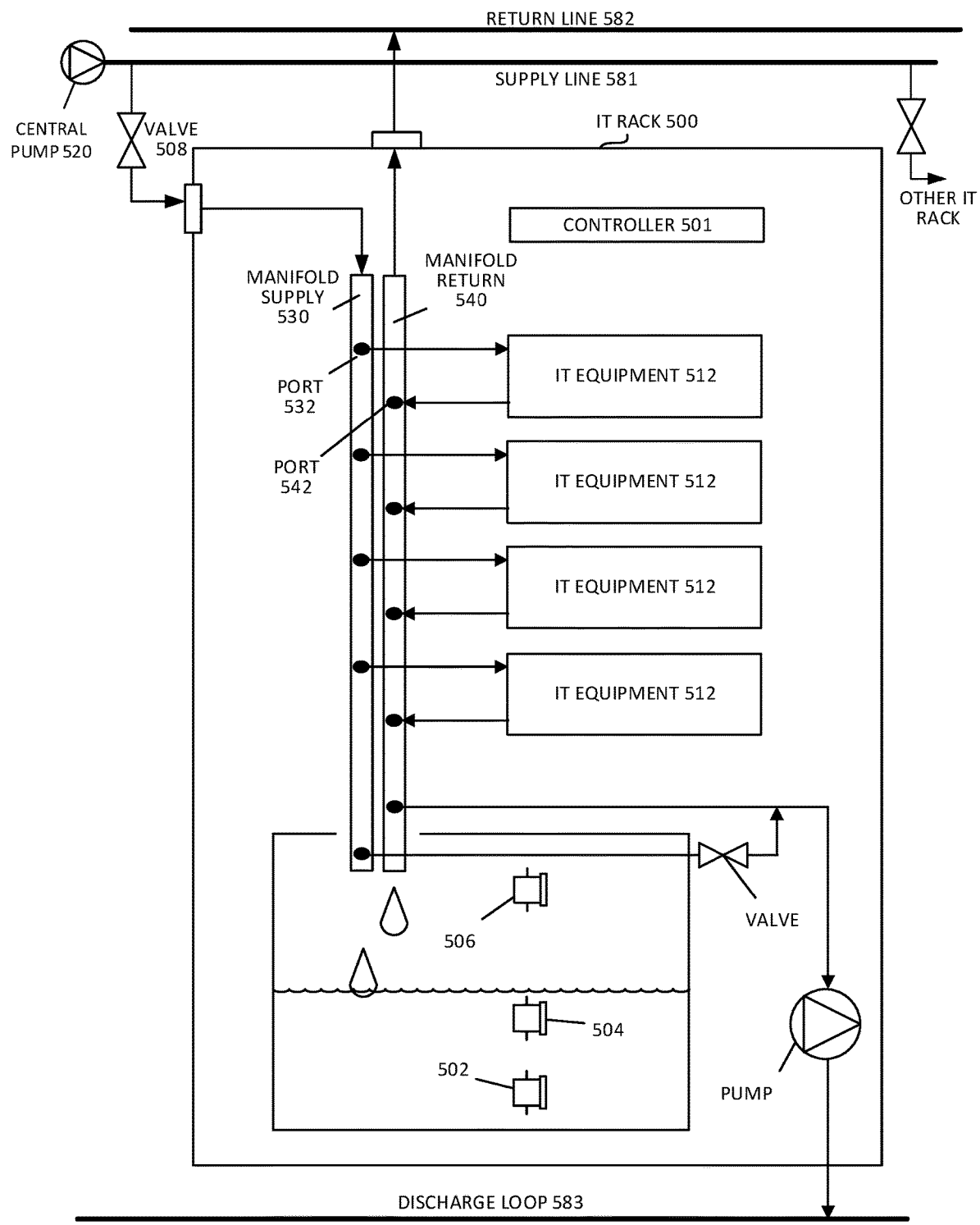
FIG. 5 shows an example IT rack with cooling system with an input fluid valve, according to some embodiments.

FIG. 5 shows an example IT rack 500 with cooling system with an input fluid valve 508, according to some embodiments. A central pump 520 can distribute fluid to a cluster of IT racks such as IT rack 500 through a supply line 581. Each IT rack can include valve 508 that can be controlled by respective controllers of each IT rack, such as controller 501. In such an open loop system with multiple IT rack systems, the controller 501 can reduce or stop the flow of the fluid into the manifold supply line 530, by controlling a position of the valve 508, thereby limiting the flow of fluid from the supply line 581 to the manifold supply line of the IT rack. The central pump in such a configuration can remain pumping at a constant effort, regardless of whether a particular IT rack within a cluster has detected a leak. Thus, leak detection and remedial action can be implemented individually for each IT rack, without affecting the fluid supply to remaining IT racks in the cluster.

The central pump can pump supply line fluid to multiple IT racks. This supply line fluid can be chilled. Under normal operation, valve 508 can be controlled to be completely open. IT equipment 512 can connect to ports 532 on the manifold supply line to receive cool fluid. The fluid can absorb thermal energy from the IT equipment. The IT equipment can fluidly connect to ports 542 of the manifold return line 540 so that the manifold can collect warmed fluid from each of the IT equipment. The fluid ports 532 and 542 can be understood as fluid connectors, such as manual mating dripless connectors, blind mating dripless connectors, or other connectors. IT equipment can connect to each fluid port of with corresponding mating connectors.

The manifold return line can connect to a shared return line 582 that is shared between the multiple devices. Although not shown, this return line fluid can be cooled by a chiller, refrigeration, a fan, and/or other cooling techniques, and then circulated back into the supply line.

A leak detecting container 507 can include one or more sensors such as fluid sensor 502, 504, and 506. As discussed in other sections, depending on the which sensor is detecting the leak, and/or the time between leak detections, the controller can take varying remedial actions to address the level or severity of the detected leak. The controller can pump out fluid from the return and/or supply line of the manifold, and deposit the fluid to a discharge loop 583. The discharge loop can be shared by the other IT racks, as a manner for each of the IT racks in the cluster to deposit leaked fluid. The discharge loop can be fluidly separate and isolated from the return line and supply line, although in some embodiments, the leaked fluid can be reintroduced from the discharge loop to the supply or return line.

Figure 6:
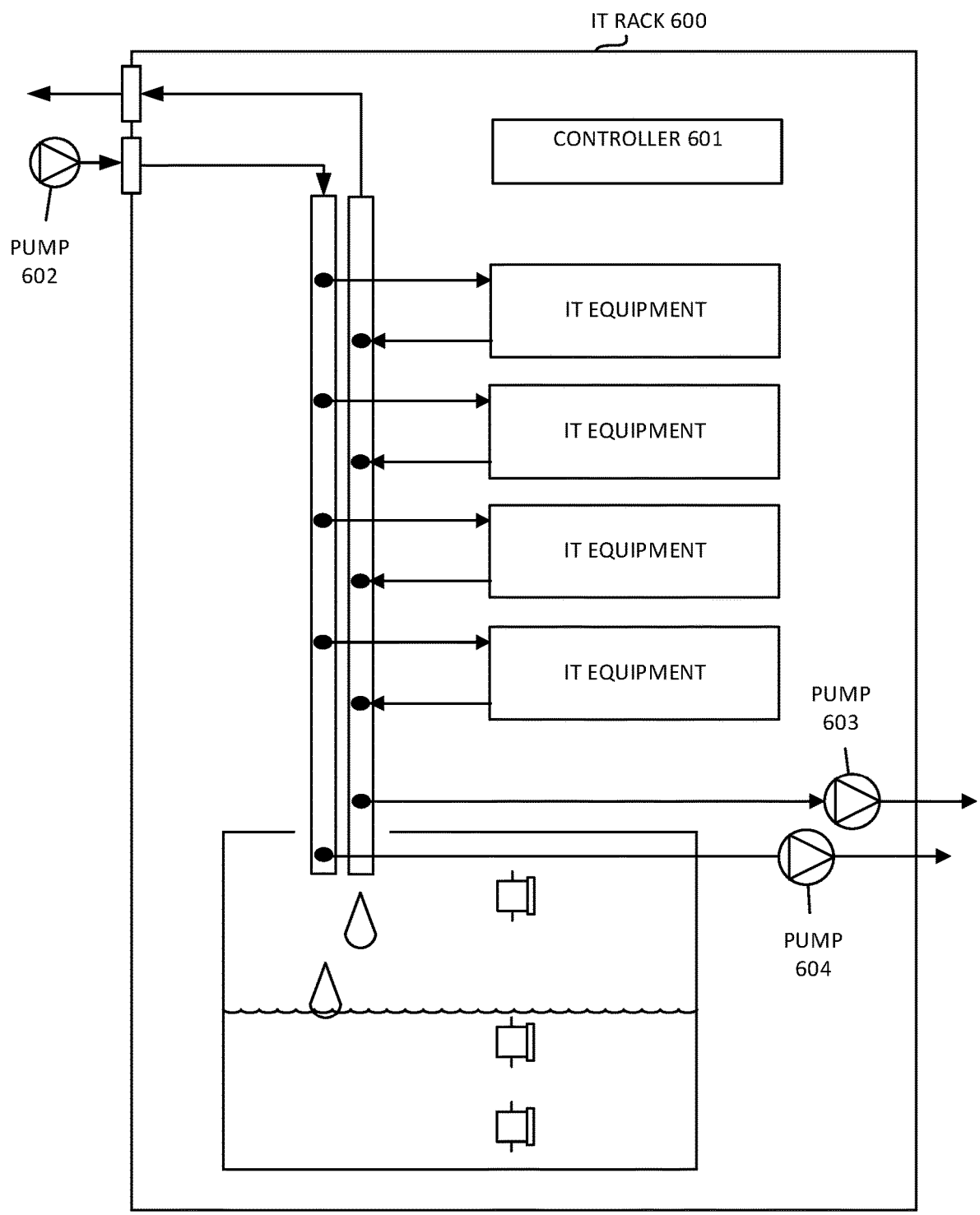
FIG. 6 shows an example IT rack with cooling system with an input fluid pump, according to some embodiments.

FIG. 6 shows an example IT rack 600 with cooling system with an input fluid pump, according to some embodiments. This can be referred to as a closed system architecture. As described, the controller can monitor status of sensors in a container that is arranged to capture leaked fluid from the cooling system. In response to different scenarios, the cooling system can take various remedial measures that are commensurate to the severity of the leak. In this closed system arrangement, to control the fluid flow rate to the manifold, the controller 601 can control input fluid pump 602 to reduce the pump flow which can include completely stopping the fluid flow, as discussed. The controller can activate pump 603 to pump fluid from the return line manifold, for example, when a leak is detected (but not when there is no leak). If the leak is deemed to be severe (e.g., the leaked fluid is detected at the highest position in the container), then the controller can activate pump 604 to further pump fluid from the manifold supply line, thus reducing the risk to the IT equipment and reducing the risk that the container overflows. As described, instead of using two pumps, a pump and a valve can be used to pump fluid from each of the manifold supply line and manifold return line in a selective manner.

Figure 7:
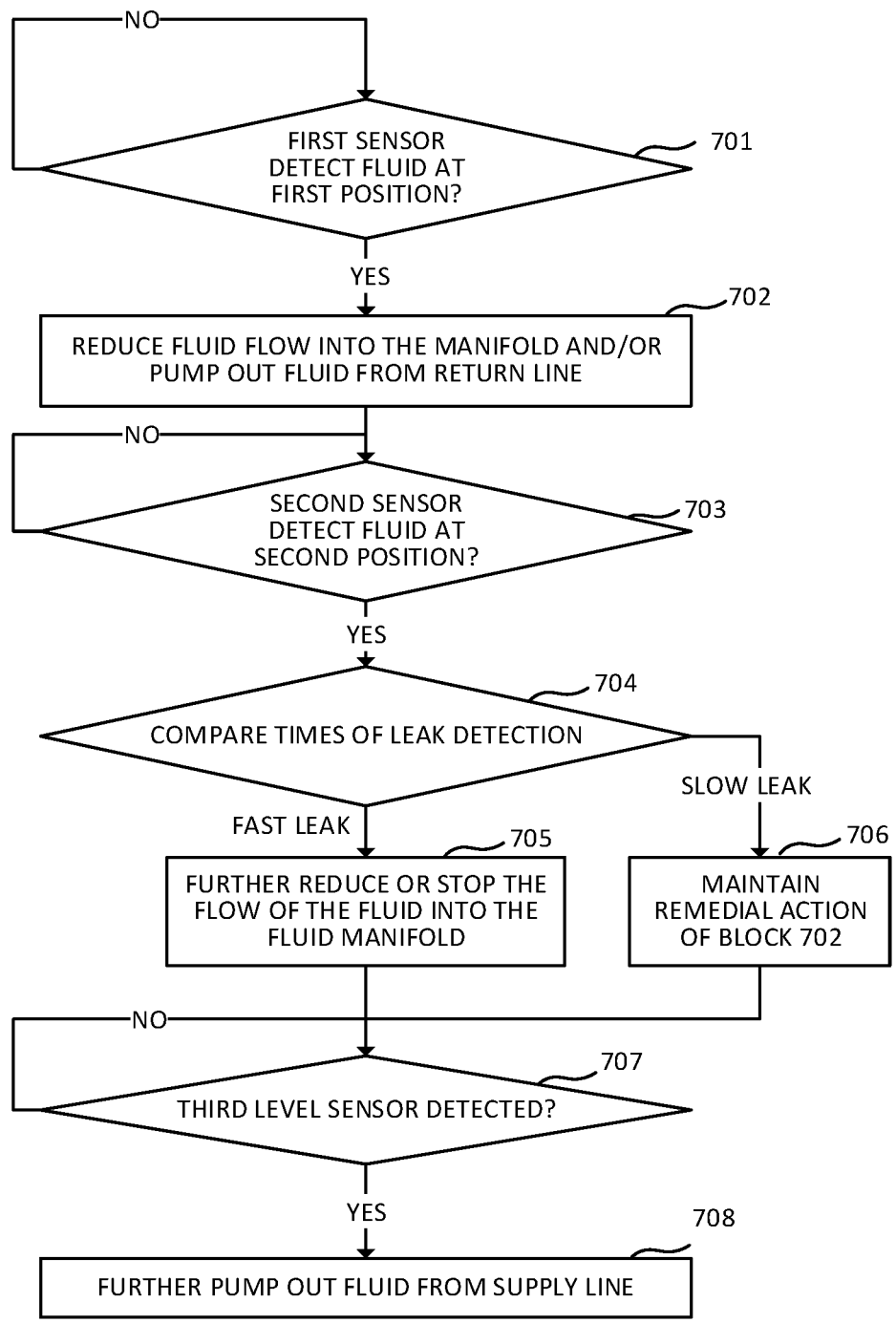
FIG. 7 shows a flow diagram for managing fluid of a cooling system with leak sensing, according to some embodiments.

FIG. 7 shows a flow diagram for managing fluid of a cooling system with leak sensing, according to some embodiments. The operations can be performed by a controller of a cooling system installed to an IT rack, as described in other sections.

At block 701, the controller can monitor the status of a first fluid sensor. The first sensor can have a lowest position in the container, thus, it can be used as a proxy to determine whether or not there is a leak. If the controller receives an indication that the first sensor detects fluid at the first position in a fluid leak container, the controller can proceed to block 702. If no leak is detected, the controller can maintain normal operation, e.g., the flow of the fluid into the fluid manifold is not reduced. As discussed, the container can be arranged to detect leaks from the manifold and/or leaks from the IT equipment to the manifold.

At block 702, the controller can reduce fluid flow into the manifold, in response to the detected leak. Additionally, or alternatively, the controller can pump fluid from the manifold return line, to more quickly extract fluid from the cooling system.

At block 703, the controller can receive an indication from a second fluid sensor located at a second position that is above the first position of the first fluid sensor. If the second fluid sensor does not detect a fluid, then the cooling system can maintain the action taken at block 702. If, however, the second sensor does sense the leak, the controller can proceed to block 704. At block 704, the controller can compare times that the leaks were detected by the first sensor and second sensor, and further reduce the flow of the fluid into the manifold based on a difference in time between when the fluid was detected by the first fluid sensor and when the fluid was detected by the second fluid sensor.

For example, if the difference in time is not below a threshold time t*, then the controller can proceed to block 706. At block 706, the controller can continue to maintain the remedial action taken at block 702.

If, however, the difference in time is below the threshold time t*, this can indicate that the leak is fast, thus, the system can proceed to block 705. At block 705, the controller can take additional remedial action, such as further reduce or completely stop the fluid flow into the manifold. The other remedial actions taken at block 702, such as pumping the fluid from the return line of the manifold, can be maintained. In either case, the controller can proceed to block 707 after maintaining the remedial action at block 706, or taking further action at block 705.

At block 707, the controller can monitor status of a third sensor that is arranged to detect fluid at a third position in the container, which is higher than the second position of the second sensor. If the third sensor detects the fluid at the third position, then the controller can proceed to block 708. At block 708, the controller can take additional measures such as pump out fluid from a manifold supply line, as well as maintain previous measures such as pumping out fluid from the manifold return line and stopping the fluid flow into the manifold. If the third sensor does not detect the fluid at the third position, the controller can continue to monitor the status of the third sensor while maintaining the previous remedial measure taken at block 705 or block 706.

It should be understood that the process can be performed with a container having more than three sensors. For example, blocks 701 and 702 can be performed for the lowest positioned sensor. Similarly, blocks 703, 704, 705 and 706 can be repeated for detection of leaks by any two fluid sensors in the container. Similarly, blocks 707 and 708 can be performed for the highest positioned fluid sensor.

It should be understood that some features described and shown in the drawings can vary without departing from the scope of the disclosure. For example, the cooling loop design of the cooling facility vary from that shown in the drawings. Further, additional valve or auxiliary units can be added to the cooling system for additional features. Further, different types of valves, e.g., three way valves, can be implemented in the cooling system to achieve the same results. In some embodiments, the controller may adjust opening ratios between completely closed (0%) and completely open (100%) of any of the valves as described herein.

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A cooling distribution system including
a fluid manifold;
a container, arranged to capture a fluid that leaks from the fluid manifold;
a first fluid sensor, arranged to detect the fluid at a first position in the container;
a second fluid sensor, arranged to detect the fluid at a second position in the container that is higher than the first position; and
a controller, configured to:
reduce a flow of the fluid into the fluid manifold, in response to the fluid in the container being detected at the first position,
in response to the fluid being detected at the second position, determine a difference in time between when the fluid is detected at the first position and when the fluid is detected at the second position, and
further reduce the flow of the fluid into the fluid manifold based on the difference in time.

2. The cooling system of claim 1, further comprising a discharge pump, arranged on a return line of the fluid manifold, wherein the controller is further configured to pump out the fluid from the return line of the fluid manifold, in response to the fluid in the container being detected at the first position.

3. The cooling system of claim 2, wherein if the difference in time is less than a threshold, then the controller stops the flow of the fluid into the fluid manifold and continues to pump out the fluid from the return line of the fluid manifold.

4. The cooling system of claim 3, wherein if the difference in time is not less than the threshold, then the controller maintains a reduced flow of the fluid into the fluid manifold and continues to pump out the fluid from the return line of the fluid manifold.

5. The cooling system of claim 2, further comprising a third fluid sensor, arranged to detect the fluid at a third position in the container that is higher than the second position, and in response to the fluid being detected at the third position, the controller is further configured to stop the flow of the fluid into the fluid manifold, pump out the fluid from a supply line of the fluid manifold, and continue to pump out the fluid from the return line of the fluid manifold.

6. The cooling system of claim 1, wherein if the first fluid sensor does not detect the fluid at the first position, the flow of the fluid into the fluid manifold is not reduced.

7. The cooling system of claim 1, wherein the container is arranged below a supply line or a return line of the fluid manifold, having one or more openings into which the fluid flows when the fluid leaks from the fluid manifold.

8. The cooling system of claim 1, wherein the flow of the fluid is regulated and reduced by reducing a pump effort.

9. The cooling system of claim 1, wherein the flow of the fluid is regulated and reduced by adjusting a position of a valve.

10. An information technology (IT) rack, comprising:
a fluid manifold;
a container, arranged to capture a fluid that leaks from the fluid manifold;
a first fluid sensor, arranged to detect the fluid at a first position in the container;
a second fluid sensor, arranged to detect the fluid at a second position in the container that is higher than the first position; and
a controller, configured to:
reduce a flow of the fluid into the fluid manifold, in response to the fluid in the container being detected at the first position,
in response to the fluid being detected at the second position, determine a difference in time between when the fluid is detected at the first position and when the fluid is detected at the second position, and further reduce the flow of the fluid into the fluid manifold based on the difference in time.

11. The IT rack of claim 10, further comprising a discharge pump, arranged on a return line of the fluid manifold, wherein the controller is further configured to pump out the fluid from the return line of the fluid manifold, in response to the fluid in the container being detected at the first position.

12. The IT rack of claim 11, wherein if the difference in time is less than a threshold, then the controller stops the flow of the fluid into the fluid manifold and continues to pump out the fluid from the return line of the fluid manifold.

13. The IT rack of claim 12, wherein if the difference in time is not less than the threshold, then the controller maintains a reduced flow of the fluid into the fluid manifold and continues to pump out the fluid from the return line of the fluid manifold.

14. The IT rack of claim 11, further comprising a third fluid sensor, arranged to detect the fluid at a third position in the container that is higher than the second position, and in response to the fluid being detected at the third position, the controller is further configured to stop the flow of the fluid into the fluid manifold, pump out the fluid from a supply line of the fluid manifold, and continue to pump out the fluid from the return line of the fluid manifold.

15. The IT rack of claim 10, wherein if the first fluid sensor does not detect the fluid at the first position, the flow of the fluid into the fluid manifold is not reduced.

16. The IT rack of claim 10, wherein the container is arranged below a supply line or a return line of the fluid manifold, having one or more openings into which the fluid flows when the fluid leaks from the fluid manifold.

17. The IT rack of claim 10, wherein the flow of the fluid is reduced by reducing a pump effort.

18. The IT rack of claim 10, wherein the flow of the fluid is reduced by adjusting a position of a valve.

* * * * *